United States Patent
Reimann

(10) Patent No.: US 7,598,782 B2
(45) Date of Patent: Oct. 6, 2009

(54) CIRCUIT FOR CHANGING A FREQUENCY

(75) Inventor: Reinhard Reimann, Heilbronn (DE)

(73) Assignee: ATMEL Germany GmbH, Heilbronn (DE)

( * ) Notice: Subject to any disclaimer, the term of this patent is extended or adjusted under 35 U.S.C. 154(b) by 94 days.

(21) Appl. No.: 11/485,348

(22) Filed: Jul. 13, 2006

(65) Prior Publication Data
US 2006/0284676 A1    Dec. 21, 2006

Related U.S. Application Data

(63) Continuation of application No. PCT/EP2005/000149, filed on Jan. 11, 2005.

(30) Foreign Application Priority Data
Jan. 13, 2004    (DE)    ........................ 10 2004 002 826

(51) Int. Cl.
H03B 19/00    (2006.01)
(52) U.S. Cl. ........................ 327/119; 327/120; 327/116
(58) Field of Classification Search ................. 327/116, 327/119; 330/101, 103
See application file for complete search history.

(56) References Cited

U.S. PATENT DOCUMENTS

| 4,019,118 A | 4/1977 | Harwood |
|---|---|---|
| 4,734,591 A | 3/1988 | Ichitsubo |
| 5,396,659 A | 3/1995 | Kimura |
| 6,023,363 A * | 2/2000 | Harada et al. ................ 398/209 |
| 6,765,377 B1 * | 7/2004 | Lu ........................... 324/123 R |

FOREIGN PATENT DOCUMENTS

| JP | 56-162505 | 12/1981 |
|---|---|---|
| JP | 57-184306 | 11/1982 |

OTHER PUBLICATIONS

Reinhard Reimann et al., "Bipolar High-Gain Limiting Amplifier IC for Optical-Fiber Receivers Operating up to 4 Gbit/s," IEEE Journal of Solid-State Circuits, vol. SC-22, No. 4, Aug. 1987.
M. Siccardi et al., "A New Design Philosophy for High Phase Stability Odd Order Frequency Multipliers," 1996 IEEE International Frequency Control Symposium, No. 0-7803-3309-8/96.

* cited by examiner

*Primary Examiner*—Lincoln Donovan
*Assistant Examiner*—Daniel Rojas
(74) *Attorney, Agent, or Firm*—Muncy, Geissler, Olds & Lowe, PLLC

(57) ABSTRACT

A circuit is provided for multiplying a frequency by a cascade formed of a transadmittance having a transfer characteristic and a transimpedance having a transfer characteristic. The transadmittance includes two terminals for a signal of a first frequency and the transimpedance includes two terminals for a signal of a second frequency. A transfer characteristic of the transimpedance is steeper than a transfer characteristic of the transadmittance, and a modulation region of the transadmittance is larger than a modulation region of the transimpedance.

15 Claims, 3 Drawing Sheets

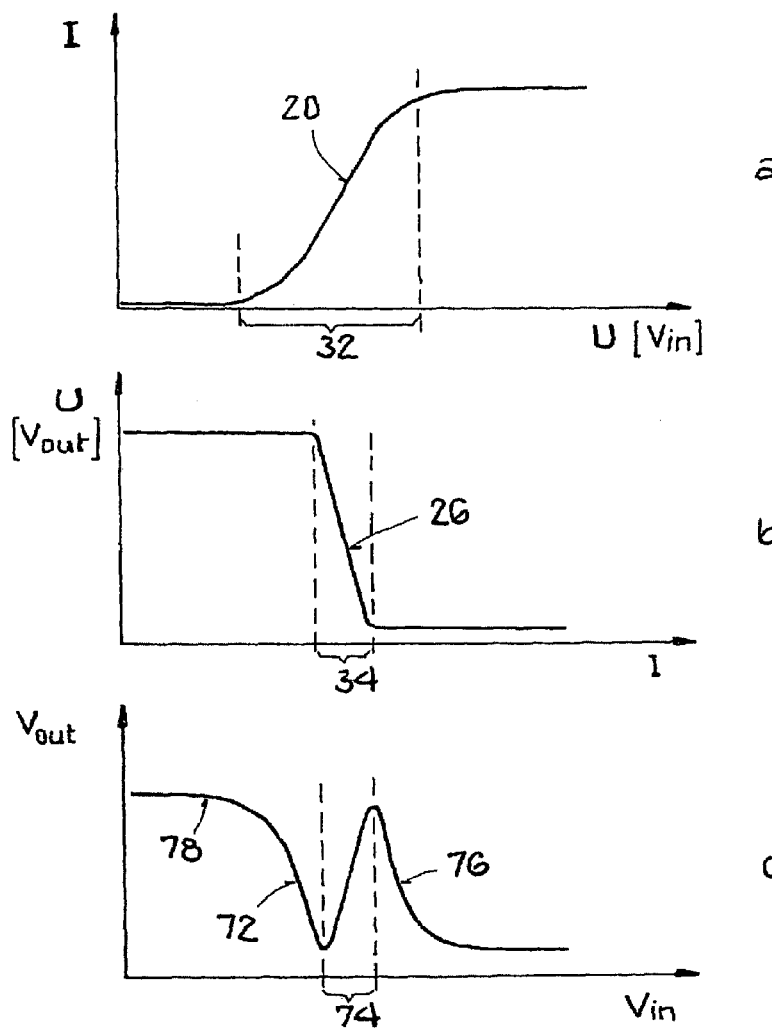
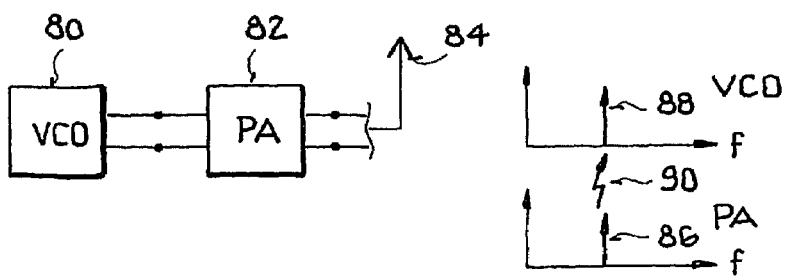

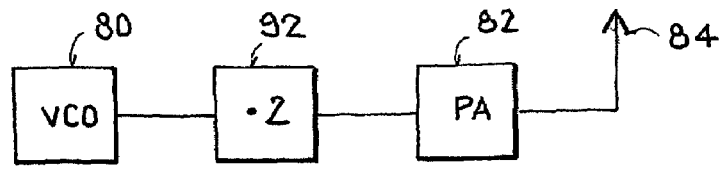
FIG.4b
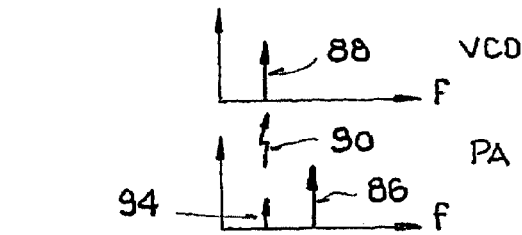
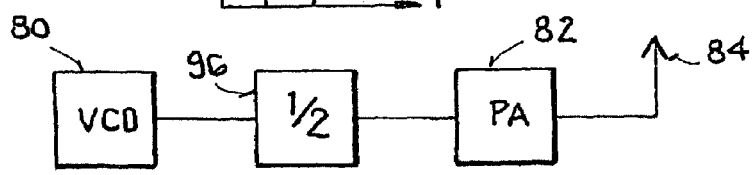
FIG.4c
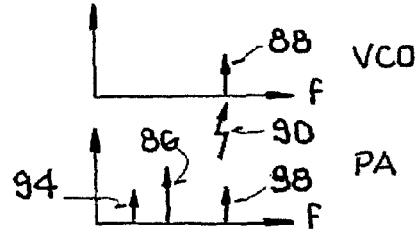
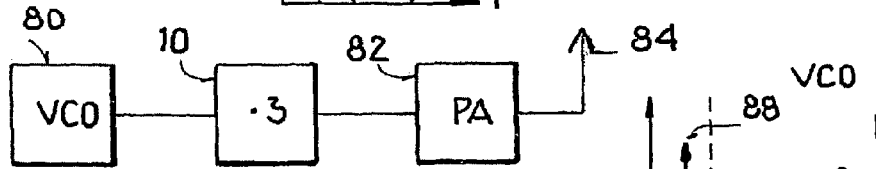
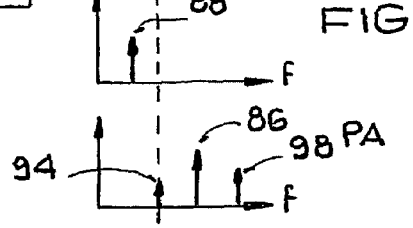
FIG.4d
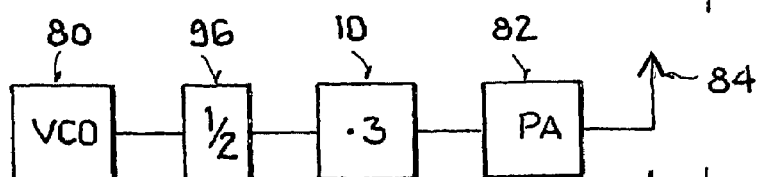
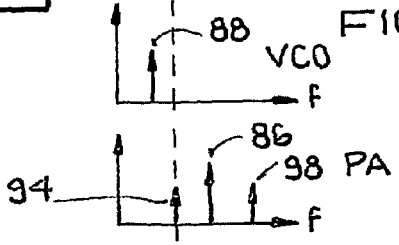
FIG.4e

CIRCUIT FOR CHANGING A FREQUENCY

This nonprovisional application is a continuation of International Application No. PCT/EP2005/000149, which was filed on Jan. 11, 2005, and which claims priority to German Patent Application No. DE 102004002826, which was filed in Germany on Jan. 13, 2004, and which are both herein incorporated by reference.

BACKGROUND OF THE INVENTION

1. Field of the Invention

The present invention relates to a circuit for changing a frequency having a cascade including a transadmittance with a voltage-current transfer characteristic and a transimpedance with a current-voltage transfer characteristic, wherein the transadmittance has two terminals for a signal of a first frequency and the transimpedance has two terminals for a signal of a second frequency.

2. Description of the Background Art

A circuit is known from the publication "Bipolar High-Gain Limiting Amplifier IC for Optical-Fiber Receivers Operating up to 4 Gbit/s," IEEE Journal of Solid State Physics, Vol. sc-22, No. 4, August, 1987.

In this context, a transadmittance is generally understood to be a voltage-to-current converter, and a transimpedance is generally understood to be a current-to-voltage converter. For reasons of cost, communication systems in the future are expected to use what are known as "one-chip" solutions which integrate a power amplifier (PA) in addition to the transmit and receive path. In such an integrated arrangement, interactions occur between the power amplifier and the voltage-controlled oscillator (VCO). In many arrangements, the VCO oscillates at the transmit frequency. In transmit operation, the output signal of the power amplifier then couples to the VCO with maximum level and detunes it. The degree of undesirable coupling increases with the power of the power amplifier, sharply limiting the output power of one-chip transceivers (transmitter/receivers).

In other arrangements the VCO oscillates at half the transmit frequency. The frequency of the output signal is then doubled. A disadvantage is that frequency doublers either have only asymmetrical output signals, or, when mixers are used, must have exact phase relationships, which vary considerably with manufacturing dispersion. Asymmetrical output signals lead to a mismatch at the output with subharmonics at half the frequency of the power amplifier, thus at the frequency of the voltage-controlled oscillator. The subharmonics interfere with the signal from the voltage-controlled oscillator. Moreover, in this concept only low reference frequencies are possible in the phase-locked loop (PLL) of the voltage-controlled oscillator, resulting in long lock times and thus long settling periods for the phase-locked loop.

It is also known to have the VCO oscillate at twice the transmit frequency. An interfering coupling of the frequency of the power amplifier into the voltage-controlled oscillator then occurs at the first harmonic (twice the frequency) of the signal of the power amplifier. The undesirable coupling is thus merely shifted to higher frequencies, where the harmonics of the power amplifier already exhibit a significant decrease in power. A disadvantage is that the coupling is merely reduced, and the maximum power thus is still limited to low values.

The use of a frequency offset between the VCO and the power amplifier is also known. Considerable effort with additional mixers and VCOs is necessary here. See also M. H. Norris, "The Design of Digital Cellular Handsets," IEEE Colloquium, pp. 4/1-4/6, March 1998.

SUMMARY OF THE INVENTION

It is therefore an object of the present invention to provide a circuit that produces an output signal at a second frequency from an input signal at a first frequency and that further reduces a coupling between the first frequency and the second frequency. In a one-chip arrangement, the circuit should be suitable for integration into an integrated circuit with a transmit path and a receive path.

This object is attained in a circuit in that the circuit components are dimensioned such that the current-to-voltage transfer characteristic of the transimpedance is steeper than the voltage-to-current transfer characteristic of the transadmittance, and such that a modulation range of the transadmittance is greater than a modulation range of the transimpedance.

At full modulation of the transadmittance, the transimpedance is systematically overmodulated. The transimpedance reacts differently, inside and outside its modulation range, to the current signal from the transadmittance. Within the modulation range of the transimpedance, the signal from the transadmittance is inverted, while outside the modulation range it is not inverted. Consequently, in combination with the difference in the steepness of the aforementioned transfer characteristics, this means that an input signal half-wave that traverses the modulation range of the transadmittance will result in three half-waves in the signal of the transimpedance. As a result of this tripling of the frequency, to a first approximation there is no feedback from the frequency of the power amplifier to the frequency of the voltage-controlled oscillator, since these frequencies cannot be transposed to one another by doubling or halving. The frequencies thus do not possess the common divisor n=2 that is critical with regard to a coupling problem.

These properties are achieved in the circuit according to an embodiment of the invention, by an altered dimensioning of the circuit components involved, which determine the modulation range and transfer characteristics of the transimpedance and the transadmittance. The prior art dimensioning is performed such that the modulation range of the transimpedance is greater than the modulation range of the transadmittance, which prevents systematic overmodulation.

It is preferred for the transadmittance to have a first symmetrical DC amplifier that has a first transistor circuit, a second transistor circuit, and a first constant-current source that is connected to a common emitter terminal of the first transistor circuit and the second transistor circuit.

It is also preferred for the transimpedance to have a second symmetrical DC amplifier that has a third transistor circuit and a fourth transistor circuit, wherein the third transistor circuit and the fourth transistor circuit each have at least one emitter circuit with negative voltage feedback and have a second constant current source, wherein the second constant current source is connected to a common emitter terminal of the third and fourth transistor circuits.

The implementation using a symmetrical DC amplifier provides the option of DC coupling of the involved components of VCO, transadmittance, transimpedance and power amplifier, significantly simplifying implementation of the overall circuit on one chip.

In a further embodiment, at least one of the transistor circuits can have at least one bipolar transistor.

Bipolar transistors are simple to integrate monolithically, and at the high currents used in the GHz range, have a reduced width of their structure as compared to field-effect transistors, which is advantageous in miniaturization of the circuits.

Another embodiment provides for that at least one of the transistor circuits has at least one field-effect transistor.

Further, first partial currents of the two constant-current sources can be collected at a first node that is connected to an operating voltage of the circuit through a first load resistor, for second partial currents of the two constant-current sources to be collected at a second node that is connected to the operating voltage through a second load resistor, and for a first terminal of the transimpedance to be connected to the first node and a second terminal of the transimpedance to be connected to a second node.

This embodiment leads to a symmetrical circuit design with two nodes between which there appears a differential signal that reflects the input signal at three times its frequency. As a result of the fact that, in each case, partial currents are collected in a node that is connected to the operating voltage through a load resistance, the sum of the changes in the partial currents is reflected in voltage drops across the load resistances. Since these voltage drops determine the amplitude of the output signal, maximum amplitude is achieved.

Another embodiment is distinguished by integration on a chip together with a transmit path and a receive path.

By this embodiment, the production costs for communications systems can be reduced as compared to an implementation on separate chips.

It is also preferred for the circuit to have a connection, which is controllable or switchable if applicable, between the terminals of the transimpedance and the transmit path and/or the receive path.

Another embodiment provides for a connection between the terminals of the transadmittance and a voltage-controlled oscillator.

This embodiment achieves a tripling of the frequency of the voltage-controlled oscillator.

An output frequency of the voltage-controlled oscillator can be two thirds of a transmit frequency, halved for signal processing and tripled by the circuit.

In this embodiment, the voltage-controlled oscillator oscillates at two-thirds of the transmit frequency. The same advantages arise here as with a frequency ratio of one third. By interposing a division, however, voltage-controlled oscillators with a higher (doubled) frequency can be used for the same transmit frequency. The advantage of the division is then that image rejection mixers placed in the receiver are supplied with two signals that have a phase shift of 90 degrees relative to one another.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIGS. 3a-c show transfer characteristic curves for the transadmittance, the transimpedance, and the cascade as a whole; and FIGS. 4a-e illustrate frequency spectra for circuits according to the state of the art and according to the invention.

DETAILED DESCRIPTION

Figure 1:
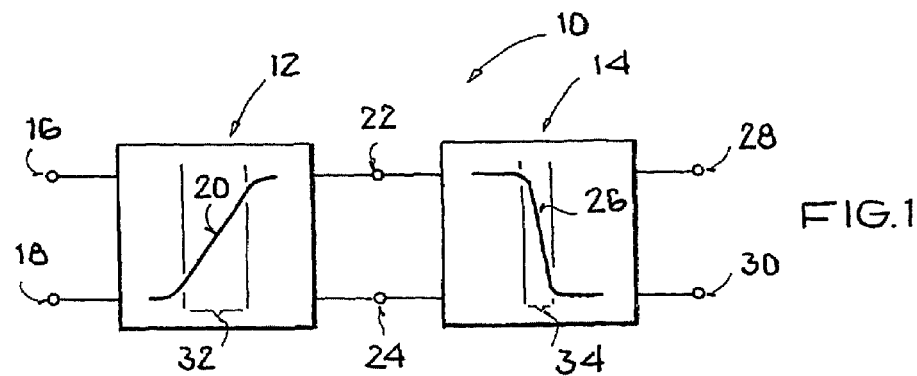
FIG. 1 is a cascade consisting of a transadmittance and a transimpedance with inventive steepnesses of transfer characteristics and modulation ranges.

Like reference numbers in the various figures designate like elements. FIG. 1 shows a circuit 10 with a transadmittance 12 and a transimpedance 14. The transadmittance 12 has two terminals 16, 18 to which a voltage-controlled oscillator with a first frequency is connected. From this, in accordance with a voltage-current transfer characteristic curve 20, the transadmittance 12 produces a current oscillation at interface terminals 22, 24, which constitute an input of the transimpedance 14. This current oscillation is converted by the transimpedance 14, in accordance with a current-voltage transfer characteristic curve 26, into an output voltage signal that appears between terminals 28, 30 and has a second frequency. In accordance with the invention, the transadmittance 12 is matched to the transimpedance 14 such that the current-to-voltage transfer characteristic curve 26 of the transimpedance 14 is steeper than the voltage-to-current transfer characteristic curve 20 of the transadmittance 12, and such that a modulation range 32 of the transadmittance 12 is greater than a modulation range 34 of the transimpedance 14. In this regard, a modulation range encompasses all points on the transfer characteristic curve where the transfer characteristic curve has a specific minimum slope. A modulation range is thus a range in which input signal changes result in usable output signal changes.

Before the signal characteristics of such a circuit 10 are described in detail below with reference to FIG. 3, we will first describe, with reference to FIG. 2, a concrete exemplary embodiment of the circuit 10 with which it is possible to implement appropriate modulation ranges 32, 34 and transfer characteristics 20, 26.

Figure 2:
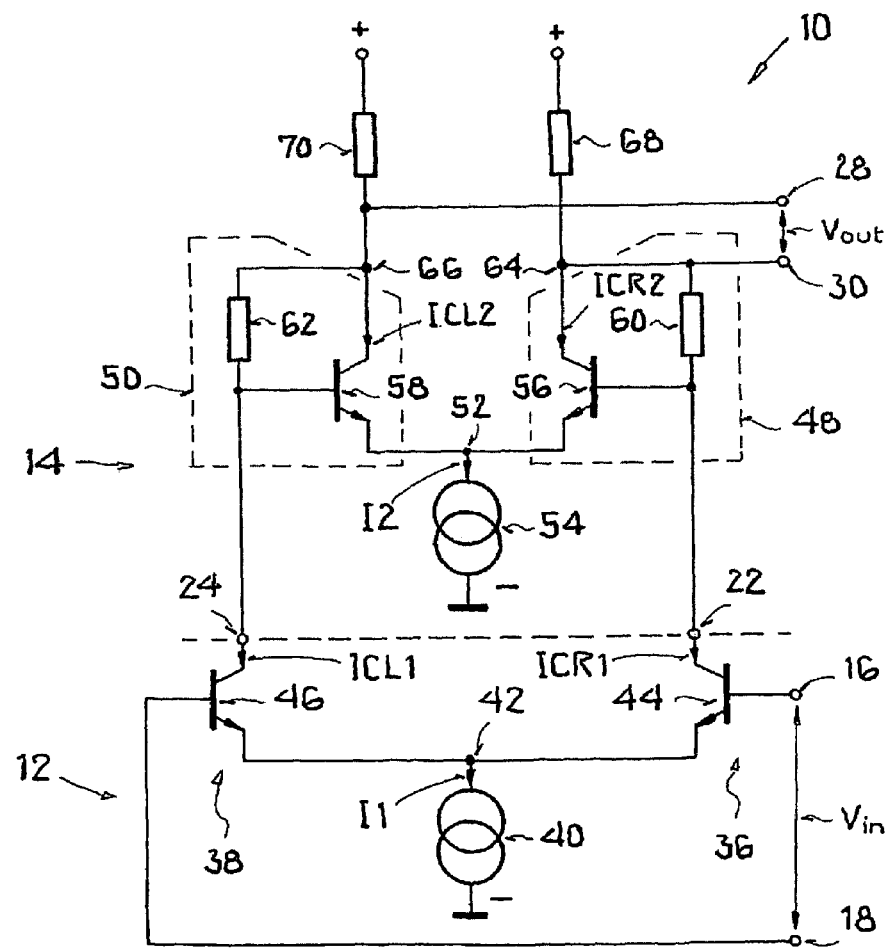
FIG. 2 is a detailed circuit implementation of the cascade.

In the exemplary embodiment in FIG. 2, a transadmittance 12 is implemented as a symmetrical DC amplifier with a first transistor circuit 36, a second transistor circuit 38, and a first constant-current source 40. The first constant-current source 40 is connected to a common emitter node 42 of the two transistor circuits 36, 38 and has the effect that the sum of the emitter currents and thus, ignoring the base currents, also the sum of the collector currents ICR1 of the first transistor circuit 36 and ICL1 of the second transistor circuit 38, remains constant. Each transistor circuit 36, 38 has at least one single transistor 44, 46 whose base is connected to one of the terminals 16, 18. A constant current I1 from the first constant-current source 40 distributes itself between the collector currents ICR1 and ICL1, which are transferred to the interface terminals 22 and 24 at the transimpedance 14, as a function of the voltages at the input terminals 16, 18.

The transimpedance 14 also has a symmetrical structure. A third transistor circuit 48 and a fourth transistor circuit 50 have a common emitter node 52 that is connected to a second constant-voltage source 54. Each transistor circuit 48, 50 has at least one single transistor 56, 58 whose respective base is driven by one of the interface terminals 22 and 24. Resistors 60, 62 provide a negative voltage feedback by which the voltage at the collector of each transistor circuit 48, 50 is fed back to the base of the respective base of the transistor 56, 58. The current I2 from the constant-current source 46 distributes itself between the collector currents ICR2 of the transistor circuit 48 and ICL2 of the transistor circuit 50 as a function of the voltages at the interface terminals 22, 24, and thus at the bases of the transistor circuits 48 and 50. The right collector currents ICR1 and ICR2 are collected at a node 64. Similarly, the left collector currents ICL1 and ICL2 are collected at a node 66. Each of the nodes 64, 66 is connected through a load resistor 68, 70 to an operating voltage (+). The nodes 64 and 66 are connected to terminals 28 and 30, from which the output signal of the circuit 10 is obtained. In the absence of current flow through the load resistors 68 and 70, the operating voltage appears at the terminals 28 and 30. In the presence of a current flow through the load resistors 68 and 70, the operating voltage reduced by the voltage drop across the load resistors 68, 70 appears at the terminals 28 and 30. An increased current results in a reduction of the voltage at the terminals 28, 30, so that the current signal is inverted by this type of measurement.

For equal voltages at the terminals 16 and 18 (V_in=0), the circuit 10 is at a symmetrical operating point. The following then applies:

$$ICL1=ICR1\approx\tfrac{1}{2}I1 \text{ and } ICL2=ICR2\approx\tfrac{1}{2}I2.$$

The summation of the currents ICR1 and ICR2 at node 64 and of the currents ICL1 and ICL2 at node 66, in combination with the voltage conversion by the load resistors 68 and 70, also results in a state at the terminals 28 and 30 that has no differential DC voltage (V_out=0). In other words, the same current I1/2 flows through right and left branches of the transadmittance 12, and the same current I2/2 flows through right and left branches of the transimpedance 14. Due to the symmetry of the arrangement, V_out=0. The sum I1/2+I2/2 flows through each load resistor 68, 70, generating equal voltage drops from the operating voltage there. According to the invention, the circuit 10 is dimensioned such that I1 is larger than I2.

When the voltage at the terminal 16 of the right branch of the transadmittance 12 is increased and the voltage at the terminal 18 of the left branch of the transadmittance 12 is decreased by a differential symmetrical drive, an increased collector current ICR1=I1/2+delta flows through the right branch and a correspondingly decreased collector current ICR1=I1/2−delta flows through the left branch.

An increased voltage then drops across the resistors 60 and 68 of the right branch. As a result, the voltage at the base terminal 22 of the right transistor 56 is lower. Consequently, the collector current ICR2 of the transistor 56 drops.

Under the condition that the collector current ICR2 drops faster (more steeply) than the current ICR1 through the right resistor 60, the drop in collector current ICR2 initially dominates the behavior of the current ICR1+ICR2 through the resistor 68. The voltage drop at the resistor 68 becomes smaller, which causes the voltage at the connected terminal 30 to rise. In an analogous manner, the voltage at the terminal 28 drops as a result of the symmetrical drive.

When the collector current ICR2 in the right branch of the transimpedance 14 has reached its minimum (zero) and the collector current ICL2 in the left branch of the transimpedance 14 has reached its maximum (I2), the transimpedance 14 is fully modulated. Thus it cannot further increase the current ICL1+ICL2 through the load resistor 70 and cannot further decrease the current ICR1+ICR2 through the load resistor 68.

The maximum voltage difference between the terminals 28, 30 is thus determined by the symmetrical deviations, with different arithmetic signs, of the collector currents summed at the nodes 64, 66 from the associated collector currents at the operating point of the transistors 56, 58. The maximum amplitude defines the modulation range 34 of the transimpedance 14.

An increase in the input amplitude beyond the value at which the inverted value is at its maximum thus does not lead to a further increase in the deviations of the collector currents ICR1, ICR2 from the operating point values. Instead, the systematic overmodulation has the effect that large input amplitudes are only inverted to the extent that correlates with the maximum collector current deviation from the operating point value. The remaining input signal amplitude, which corresponds to a current through the negative feedback resistors 60, 62 in an emitter circuit, is not inverted by a steeper opposing reaction of the transistors 56, 58 through overcompensation, and thus produces non-inverted voltage changes across the load resistors.

However, the transadmittance 12 is not fully modulated at higher signal amplitudes on account of its modulation range 32, which is wider than the modulation range 34 of the transimpedance 14, and thus can further increase the current ICR1 and further decrease the current ICL1. When the transimpedance 14 is fully modulated, the further changes in the currents ICR1 and ICL1 dominate the (non-inverted) changes in the currents through the load resistors 68 and 70. The voltage at the connected output 28 drops with further increases in the current through the load resistor 70 until the transadmittance 12 is also fully modulated. In analogous manner, the current through the load resistor 68 decreases further and, within the modulation range of the transadmittance 12, produces a rising voltage at the connected output 30.

FIG. 3 shows, in their relationships, the transfer characteristic 20 of the transadmittance 12, the transfer characteristic 26 of the transimpedance 14, and a transfer characteristic 72 of the overall circuit 10. FIG. 3a shows the current-to-voltage transfer characteristic 20 of the transadmittance 12, with a relatively wide modulation range 32 in which the transfer characteristic 20 exhibits a comparatively low slope. FIG. 3b shows the transfer characteristic 26 of the transimpedance 14, with a relatively narrow modulation range 34 and a comparatively steep transfer characteristic slope. FIG. 3c shows the overall transfer function 72 resulting from the interaction of the transadmittance 12 and the transimpedance 14. In the linear modulation range 34 of the transimpedance 14, the input signal V_in undergoes a phase rotation (inversion) due to both the transadmittance 12 and the transimpedance 14. Thus, the output signal V_out is back in phase with the input signal V_in. On account of the larger modulation range 32 of the transadmittance 12, the transimpedance 14 reaches its limit outside its modulation range 34 first. With further modulation of the transadmittance 12, the output current then flows directly—without inversion by the transimpedance 12—through the feedback resistors 60, 62 to the nodes 64 and 66.

The overall transfer function 72 thus exhibits a range 74 of high gain within a narrow modulation range (in phase) with a subsequent phase reversal on both sides 76, 78 of the range 74. If an input signal V_in having sufficient amplitude is applied to the inputs 16, 18, the entire transfer characteristic 72 is traversed, and the frequency of the input signal V_in is tripled in the output signal V_out.

The frequency tripling is explained below with alternate reference to FIGS. 2 and 3. With small modulation (terminal 16 slightly positive with respect to terminal 18), ICR1 is larger than ICL1. Consequently, this causes a larger voltage drop at the right negative feedback resistor 60 than at the left negative feedback resistor 62. As a result, transistor 56 is cut off with respect to transistor 58, and ICL2 is greater than ICR2. Due to the greater slope of the transfer characteristic of the transimpedance 14, it follows for the sums of the currents that ICR1+ICR2 is less than ICL1+ICL2. Thus, a double inversion takes place in the range of small modulation, with no change in the frequency occurring. This corresponds to the behavior of the prior art circuit in which the constant current amplitude 11 of the transadmittance 12 is smaller than the constant current amplitude 12 of the transimpedance 14. The range of small modulations corresponds to the modulation range of the transimpedance 14 labeled with the reference number 34 in FIG. 3b.

In contrast, if terminal 16 is strongly positive relative to terminal 18 as a result of a large differential modulation that exceeds the modulation range 34, other effects occur that establish the large signal characteristics. It is still the case that ICR1 is larger than ICL1, but ICR2 remains constant at the value I2, and ICL2 at zero, since the transimpedance 14 is already fully modulated. This therefore results in a further increasing current through the negative feedback resistor 60 and a further decreasing current through the negative feedback resistor 62. The summation of the currents results in the reversal of the summation current shown in FIG. 3c. Selection of the relationship between I1 and I2, with I1 larger than I2, results in the overall transfer function 72 according to FIG. 3c. In other words, redimensioning the circuit (I1>I2) achieves the result that the input current swing of the transadmittance 12 has a larger linearity range (modulation range) 32 than would be required by the maximum amplitude of the transimpedance 14. As a result, the transimpedance 14 is overmodulated, and the additional current reaches the output directly without inversion. In particular, it can be seen from FIG. 3c that each input half-wave results in exactly three half waves at the output, thus a frequency tripling.

FIG. 4a shows a classical circuit topology in which a voltage-controlled oscillator 80 (VCO) oscillates at the same frequency of, for example, 2.5 GHz, as the power amplifier 82 (PA), which feeds an antenna 84. As a result, a frequency 86 of the power amplifier 82 can directly interfere with the frequency 88 of the voltage-controlled oscillator 80. The potential coupling is represented by the arrow 90.

With frequency doubling by an interposed doubler 92, as shown in FIG. 4b, a subharmonic 94 of the power amplifier frequency 86 can interfere with the frequency 88 of the oscillator. With frequency halving by an interposed divider 96 as shown in FIG. 4c, the first harmonic 98 of the power amplifier 82 can interfere with the oscillator 80. In contrast, with frequency tripling by the interposition of an inventive circuit 10 as shown in FIG. 4d and with an additional halving as shown in FIG. 4e, no interfering feedback occurs, since the frequencies 86, 88 that are involved are relatively prime to a certain extent. Undesirable couplings only appear at higher harmonics of the oscillator and power amplifier frequencies 88, 86. This is relatively noncritical, however, since frequency components at relatively high frequencies (10 GHz, 14 GHz, . . . ) are strongly damped in other signal processing stages by parasitic components of the output wiring.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A frequency multiplying circuit for multiplying a first frequency, the circuit comprising: a transadmittance portion having a first transfer characteristic, the transadmittance portion having two input terminals for a signal of said first frequency; and a transimpedance portion having a second transfer characteristic, the transimpedance portion having two output terminals for a signal of a second frequency higher than the first frequency as an output of said multiplying circuit, wherein a transfer characteristic of the transimpedance portion is steeper than a transfer characteristic of the transadmittance portion, and wherein a modulation range of the transadmittance portion is greater than a modulation range of the transimpedance portion.

2. The circuit according to claim 1, wherein the transadmittance portion has a first symmetrical DC amplifier with a first transistor circuit, a second transistor circuit, and a first constant-current source that is connected to a common emitter terminal of the first transistor circuit and the second transistor circuit.

3. The circuit according to claim 2, wherein the transimpedance portion has a second symmetrical DC amplifier that has a third transistor circuit and a fourth transistor circuit, wherein the third transistor circuit and the fourth transistor circuit each include at least one transistor, and a resistor connected between the collector and the base of the transistor and said transimpedance portion further including a second constant current source, and wherein the second constant current source is connected to a common emitter terminal of the third and fourth transistor circuits.

4. The circuit according to claim 3, wherein at least one of the first, second, third or fourth transistor circuits has at least one bipolar transistor.

5. The circuit according to claim 3, wherein at least one of the first, second, third or fourth transistor circuits has at least one field-effect transistor.

6. The circuit according to claim 3, wherein first partial currents of the two constant-current sources are collected at a first node that is connected to an operating voltage of the circuit through a first load resistor, second partial currents of the two constant-current sources are collected at a second node that is connected to the operating voltage through a second load resistor, and wherein a first terminal of the transimpedance portion is connected to the first node and a second terminal of the transimpedance portion is connected to a second node.

7. The circuit according to claim 1, wherein the transadmittance portion and the transimpedance portion are integrated on a chip with a transmit path and a receive path.

8. The circuit according to claim 7, wherein an electrical connection is formed between the terminals of the transimpedance portion and a transmit path or a receive path.

9. The circuit according to claim 8, wherein an electrical connection is formed between the terminals of the transadmittance portion and a voltage-controlled oscillator.

10. The circuit according to claim 9, wherein an output frequency of the voltage-controlled oscillator is two thirds of a transmit frequency, halved for internal signal processing and tripled by the circuit.

11. The circuit according to claim 1, wherein the transadmittance portion is in series with the transimpedance portion.

12. A frequency multiplying circuit for multiplying a first frequency, the circuit comprising: a transadmittance portion having a voltage-current transfer characteristic, the transadmittance portion having two input terminals for a signal of said first frequency; and a transimpedance portion having a current-voltage transfer characteristic, the transimpedance portion having two output terminals for a signal of a second frequency, which is higher than said first frequency, and which is output from said multiplying circuit, wherein a modulation range of the transadmittance portion is greater than a modulation range of the transimpedance portion.

13. The circuit according to claim 12, wherein the current-voltage transfer characteristic of the transimpedance portion is steeper than voltage-current transfer characteristic of the transadmittance portion.

14. The circuit according to claim 1, wherein said transadmittance portion includes two transadmittance output terminals and said transimpedance portion includes two transimpedance input terminals and wherein said two transadmittance output terminals are directly connected to said two transimpedance input terminals.

15. The circuit according to claim 12 wherein said transadmittance portion includes two transadmittance output terminals and said transimpedance portion includes two transimpedance input terminals and wherein said two transadmittance output terminals are directly connected to said two transimpedance input terminals.

* * * * *